US00RE38254E

(19) United States
(12) Reissued Patent
Sato et al.

(10) Patent Number: US RE38,254 E
(45) **Date of Reissued Patent: *Sep. 16, 2003**

(54) POSITIVE RESIST COMPOSITION

(75) Inventors: Kazufumi Sato, Kawasaki (JP); Kazuyuki Nitta, Kawasaki (JP); Akiyoshi Yamazaki, Kawasaki (JP); Yoshika Banba, Kawasaki (JP); Toshimasa Nakayama, Kawasaki (JP)

(73) Assignee: Tokyo Ohka Kogyo Co., Ltd., Kawasaki (JP)

( * ) Notice: This patent is subject to a terminal disclaimer.

(21) Appl. No.: 09/956,516

(22) Filed: Sep. 20, 2001

Related U.S. Patent Documents

Reissue of:
(64) Patent No.: 5,955,240
Issued: Sep. 21, 1999
Appl. No.: 08/738,784
Filed: Oct. 29, 1996

(30) Foreign Application Priority Data

Oct. 30, 1995 (JP) ..... 7-305113

(51) Int. Cl.[7] ..... C08F 112/14; G03F 7/038; G03F 7/004

(52) U.S. Cl. ..... 525/333.3; 525/328.9; 525/385; 526/313; 430/170; 430/270.1; 430/905

(58) Field of Search ..... 526/313; 525/328.9, 525/333.3, 385; 430/270.1, 170, 905

(56) References Cited

U.S. PATENT DOCUMENTS

| | | | | |
|---|---|---|---|---|
| 4,491,628 A | | 1/1985 | Ito et al. | 430/176 |
| 5,069,997 A | | 12/1991 | Schwalm et al. | 430/270.1 |
| 5,118,585 A | | 6/1992 | Schwalm et al. | 430/326 |
| 5,229,254 A | | 7/1993 | Lohaus et al. | 430/270.1 |
| 5,314,786 A | | 5/1994 | Roeschert et al. | 430/270.1 |
| 5,314,931 A | | 5/1994 | Yamada et al. | 430/270.1 |
| 5,318,876 A | | 6/1994 | Schwalm et al. | 430/270.1 |
| 5,352,564 A | | 10/1994 | Takeda et al. | 430/270.1 |
| 5,374,500 A | | 12/1994 | Carpenter, Jr. et al. | 430/270.1 |
| 5,403,695 A | | 4/1995 | Hayase et al. | 430/270.1 |
| 5,412,050 A | | 5/1995 | Watanabe et al. | 430/270.1 |
| 5,468,589 A | | 11/1995 | Urano et al. | 430/270.1 |
| 5,525,453 A | | 6/1996 | Przybilla et al. | 430/270.1 |
| 5,556,734 A | | 9/1996 | Yamachika et al. | 430/270.1 |
| 5,558,971 A | | 9/1996 | Urano et al. | 430/170 |
| 5,558,976 A | | 9/1996 | Urano et al. | 430/326 |
| 5,558,978 A | | 9/1996 | Schadeli et al. | 430/270.1 |
| 5,627,006 A | | 5/1997 | Urano et al. | 430/270.1 |
| 5,736,296 A | * | 4/1998 | Sato et al. | 430/170 |
| 5,770,343 A | * | 6/1998 | Sato et al. | 430/170 |

FOREIGN PATENT DOCUMENTS

| | | |
|---|---|---|
| EP | 520642 | 12/1953 |
| EP | 366590 | 5/1990 |
| EP | 553737 | 8/1993 |
| JP | 3-249654 | 3/1990 |
| JP | 2-161436 | 6/1990 |
| JP | 2-62544 | 11/1991 |

* cited by examiner

*Primary Examiner*—John S. Chu
(74) *Attorney, Agent, or Firm*—Finnegan, Henderson, Farabow, Garrett & Dunner, L.L.P.

(57) ABSTRACT

Disclosed is an improved, chemically-amplifying positive resist composition for radiations, especially UV rays, deep-UV rays, excimer laser beams, X-rays, electron beams. The composition comprises (A) a resin component whose solubility in an alkaline aqueous solution is increased by the action of acids, (B) a chemical compound which generates an acid when exposed to radiations, and (C) an organic carboxylic acid compound and (D) an amine, in which said resin component (A) is a mixture comprising (a) a polyhydroxystyrene having a weight-average molecular weight of from 8,000 to 25,000 and a molecular weight distribution ($M_w/M_n$) of 1.5 or less where from 10 to 60 mol % of the hydroxyl groups have been substituted by residues of a general formula (I):

(I)

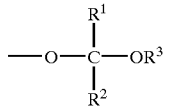

wherein $R^1$ represents a hydrogen atom or a methyl group, $R^2$ represents a methyl group or an ethyl group, and $R^3$ represents a lower alkyl group having 1 to 4 carbon atoms;

and (b) a polyhydroxystyrene having a weight-average molecular weight of from 8,000 to 25,000 and a molecular weight distribution ($M_w/M_n$) of 1.5 or less where from 10 to 60 mol % of the hydroxyl groups have been substituted by tert-butoxycarbonyloxy groups. The composition has a high sensitivity, a high resolution, high heat resistance, good width characteristic in focus depth and good post-exposure storage stability, has good storage stability as a resist solution, and gives resist patterns with good profiles, without depending on the substrate to which it is applied. The composition is useful for forming fine patterns in producing ultra-LSIs.

14 Claims, No Drawings

POSITIVE RESIST COMPOSITION

Matter enclosed in heavy brackets [ ] appears in the original patent but forms no part of this reissue specification; matter printed in italics indicates the additions made by reissue.

FIELD OF THE INVENTION

The present invention relates to a positive resist composition and, more precisely, to a chemically-amplifying positive resist composition sensitive to radiation such as UV rays, deep-UV rays, KrF or Arf excimer laser beams, X-rays, electron beams, etc., which has a high sensitivity, a high resolution, high heat resistance, good width characteristic in focus depth and good post-exposure storage stability, has good storage stability as a resist solution, and gives resist patterns with good profiles on substrates without depending on substrates to which it is applied.

BACKGROUND OF THE INVENTION

Semiconductor devices such as ICs, LSIs, etc. have heretofore been produced by repeating several times a series of processes comprising photolithography using photoresist compositions, etching, diffusion of impurities and wiring. Concretely, in the photolithographic process, a thin film of a photoresist composition is formed on a silicon wafer by means of, for example, spin coating, the resultant is exposed to radiation such as UV rays, etc., via a mask pattern for a semiconductor device, and then developed to give a resist pattern, and thereafter the silicon wafer thus having thereon the resist pattern acting as a protective film is etched. As the photoresist composition preferably used in the photolithography, there has been known a positive photoresist composition comprising, as basic components, an alkali-soluble novolak resin and a quinonediazido group-containing compound for which a resolution on the order of sub-microns (1 $\mu$m or less) or still half-microns(0.5 $\mu$m or less) is required and which uses UV rays such as g-line(436 nm) and i-line(365 nm) for exposure.

Recently, larger scale integrations in semiconductor devices are desired increasingly, requiring ultra-fine patterning on the order of quarter microns(0.25 $\mu$m or less) in the mass production of ultra-LSIs, etc. However, the conventional positive photoresist composition comprising, as basic components, an alkali-soluble novolak resin and a quinonediazido group-containing compound hardly gives such an ultra-fine patterning as mentioned above. Therefore, it has been demanded to develop a resist using deep-UV rays of shorter wavelength (200–300 nm), excimer laser beams such as KrF laser and ArF laser, electron beams and X-ray. At present, a chemically-amplifying resists which can achieve a high resolution, use the catalytic and chain reactions of the acid to be generated by exposure to radiations, have a quantum yield of 1 or more, and can achieve a high sensitivity, have been of interest and developed intensively.

As one example of such chemically-amplifying positive resists, there is known a resist comprising a resin component derived from polyhydroxystyrene by substituting its hydroxyl groups by tert-butoxycarbonyloxy groups or the like and an acid-generating agent of an onium salt or the like (U.S. Pat. No. 4,491,628).

However, the above-mentioned, known chemically-amplifying positive resist was not satisfactory in practical use, since the resolution and the width characteristic in focus depth are not satisfactory, and since it may cause a problem so-called bridging that the crosssectional profile of the patterns to be made of the resist is often broadened upward like eaves. Concretely, when the chemically-amplifying positive resist coated on a substrate are exposed, stored for a while, followed by heating treatment and then developed to give patterns, the patterns cannot have good profiles since the acids generated by the exposure are inactivated while the exposed resist films are stored. (which phenomenon is referred to as decrease in "post-exposure storage stability" of the positive resist, hereinafter)

The problem of post-exposure storage stability is peculiar to chemically-amplifying positive resists. When such bridging occurs, a desired wiring pattern cannot be given, which is a serious problem for the production of semiconductor devices. For the purpose of improving the post-exposure storage stability, there has been proposed a method in which a top coating layer is provided on a resist layer, whereby the inactivation of the acids generated by the exposure is prevented. In this method, however, the production steps are increased, which leads the decrease in throughput and high production cost as well. From these reasons, this method is unfavorable. Accordingly, there has been strongly demanded to develop a resist having good post-exposure storage stability without providing a top coating layer.

The above-mentioned chemically-amplifying positive resist has another problem that it characteristically depended on substrates to which they are applied, and some of them, when applied on a substrate such as a substrate coated with an insulating film such as silicon nitride (SiN), boron-phosphorus-silicate glass (BPSG) or the like film or on a substrate coated with titanium nitride (TiN), often formed resist patterns with poor profiles expanding downward to the substrates (which is referred to as "substrate dependency", hereinafter).

Moreover, when such resist is coated on a substrate coated with a metallic film such as an aluminum-silicon-copper (Al-Si-Cu) alloy film and a tungsten (W) film, the resist pattern formed is influenced by standing waves and the crosssectional profile of the resist pattern is waved. For the purpose of solving the problems of such substrate dependency and influence by standing waves, there has been proposed a method in which an anti-reflection coating layer is provided between the substrate and the resist layer. In this method, however, the production steps are increased, which leads the decrease in throughput and high production cost as well. From these reasons, this method is also unfavorable. Accordingly, there has been strongly demanded to develop a resist without an anti-reflection coating layer which can give resist patterns with good profile not depending on substrates to which it is applied and hardly influenced by standing waves.

In addition to the above-mentioned problems, the conventional resist compositions have still another problem. That is, a patterned resist layer has not high heat resistance and when the resist compositions are prepared in solutions, they have such a poor storage stability that the solutions often generate solid substances while the solutions are stored. Accordingly, there has also been demanded to develop a resist composition capable of giving a patterned resist layer of heat resistance and a resist solution which has a good storage stability and does not generate any solid substances during it is stored.

In these situations, we, the present inventors have assiduously studied so as to develop chemically-amplifying positive resist compositions free from the above-mentioned problems and, as a result, have found that by using, as a resin component whose solubility in an alkaline aqueous solution is increased by the action of acids, a mixture of two different polyhydroxystyrenes where the hydroxyl groups have been substituted by two different kinds of substituents in certain degrees, respectively, having a special molecular weight and special molecular weight distribution ($M_w/M_n$), a chemical compound which generates an acid of exposure to radiation and an organic carboxylic acid, it becomes possible to provide a chemically-amplifying positive resist composition sensitive to radiations such as UV rays, deep-UV rays, excimer laser beams (such as KrF laser, ArF laser, etc.). X-rays, electron beams, etc., which has a high sensitivity, a high resolution, high heat resistance, good width characteristic in focus depth and good post-exposure storage stability, has good storage stability when it is prepared in a resist solution, and gives resist patterns with good profiles on substrates without depending on substrates to which it is applied. On the basis of these findings, we have completed the present invention.

SUMMARY OF THE INVENTION

One object of the present invention is to provide a positive resist composition which is sensitive to radiations, especially deep-UV rays and excimer laser beams (such as KrF laser, ArF laser, etc.) and which has a high sensitivity, a high resolution, high heat resistance, good width characteristic in focus depth and good post-exposure storage stability and, furthermore, which has good storage stability when it is prepared in a resist solution.

Another object of the present invention is to provide a positive resist composition capable of forming resist patterns with good profiles, without depending on substrates to which it is applied.

The other objects of the present invention will be obvious from the follwing description and attached claims. A number of advantages not described herein will be found by those skilled in the art.

DETAILED DESCRIPTION OF THE INVENTION

The present invention relates to a positive resist composition containing (A) a resin component whose solubility in an alkaline aqueous solution is increased by the action of acids (Such a resin component is hereinafter simply referred to as "a resin component"), (B) a chemical compound which generates an acid when exposed to radiations (Such a compound is hereinafter referred to as "an acid-generating agent"), and (C) an organic carboxylic acid compound, in which the resin component (A) is a mixture comprising (a) a polyhydroxystyrene having a weight-average molecular weight of from 8,000 to 25,000 and a molecular weight distribution ($M_w/M_n$) of 1.5 or less where from 10 to 60 mol % of the hydroxyl groups have been substituted by residues of a general formula (I):

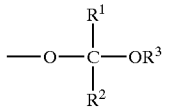

(1)

wherein $R^1$ represents a hydrogen atom or a methyl group, $R^2$ represents a methyl group or an ethyl group, and $R^3$ represents a lower alkyl group having 1 to 4 carbon atoms;

and (b) a polyhydroxystyrene having a weight-average molecular weight of from 8,000 to 25,000 and a molecular weight distribution ($M_w/M_n$) of 1.5 or less where from 10 to 60 mol % of the hydroxyl groups have been substituted by tert-butoxycarbonyloxy groups.

In the mixture as the resin component (A), component (a) is from 30 to 90% by weight and component (b) is from 10 to 70% by weight. In this, preferably, component (a) is from 50 to 80% by weight and component (b) is from 20 to 50% by weight. Concretely mentioned, as specific examples of the residues of the general formula (1) in the component (a), are 1-methoxyethoxy group, 1-ethoxyethoxy group, 1-n-propoxyethoxy group, 1-iso-propoxyethoxy group, 1-n-butoxyethoxy group, 1-iso-butoxyethoxy group, 1-(1,1-dimethylethoxy)-1-methylethoxy group, 1-methoxy-1-methyl-ethoxy group, 1-ethoxy-1-methyl-ethoxy group, 1-n-propoxy-1-methylethoxy group, 1-isobutoxy-1-methylethoxy group, 1-methoxy-n-propoxy group, and 1-ethoxy-n-propoxy group. Among these, especially preferred are 1-ethoxy-ethoxy group and 1-methoxy-n-propoxy group, since the sensitivity and the resolution of the positive resist composition containing the resin component are well balanced and improved.

In the positive resist composition of the present invention, the acid to be generated by the acid-generating agent partly decomposes the tert-butoxycarbonyloxy groups and the residues of formula (1), by which the solubility of the resin component (A) in an alkali aqueous solution on the exposed regions of the film and the dissolution-inhibiting ability thereof on the unexposed regions of the film are well balanced, resulting in that the positive resist composition has a high sensitivity, a high resolution and high heat resistance, as well as improved width characteristic in focus depth.

The above-mentioned component (a) is a polyhydroxystyrene in which the hydroxyl groups have been partly substituted by the residues of formula (1) above, for example, by a known substitution reaction between an unsubstituted polyhydroxystyrene and 1-chloro-1-ethoxyethane, 1-chloro-1-methoxypropane or the like. In this, the degree of substitution of the hydroxyl groups with such residues is from 10 to 60 mol %, preferably from 20 to 50 mol %. If the degree of substitution is less than 10 mol %, the positive resist composition containing the resin component cannot give resist patterns with good profiles. If, however, it is more than 60 mol %, the sensitivity of the composition is lowered. Therefore, the degree of substitution not falling within the defined range is unfavorable. In practical use of the composition, the degree of substitution is preferably from 20 to 50 mol %.

The above-mentioned component (b) is a polyhydroxystyrene in which the hydroxyl groups have been partly substituted by tert-butoxycarbonyloxy groups, for example, by a known substitution reaction between an unsubstituted polyhydroxystyrene and di-tert-butyl-di-carbonate or the like. In this, the degree of substitution of the hydroxyl groups with tert-butoxycarbonyloxy groups is from 10 to 60 mol %, preferably from 20 to 50 mol %. If the degree of substitution is less than 10 mol %, the positive resist composition containing the resin component cannot give resist patterns with good profiles. If, however, it is more than 60 mol %, the sensitivity of the composition is lowered. Therefore, the degree of substitution not falling within the defined range is unfavorable. In practical use of the composition, the degree of substitution is preferably from 20 to 50 mol %.

Each of the above-mentioned resin component shall have a weight-average molecular weight falling within the range between 8,000 and 25,000, measured by gel permeation chromatography (GPC) based on polystyrene. If the weight-average molecular weight is less than the defined range, the coatability of the composition containing the resin is poor. If, however, it is more than the same, the solubility of the resin in an aqueous alkaline solution is lowered. And it is essential that the resin components of the present invention shall have a molecular weight distribution ($M_w/M_n$) of 1.5 or less, which is defined as a ratio between a weight-average molecular weight and a number-average molecular weight. The heat resistance is greatly improved when a molecular weight distribution falls within in the defined range.

The acid-generating agent to be in the composition of the present invention is not specifically defined but may be any known acid-generating agent. Concretely mentioned, as the agent, are (a) bissulfonyldiazomethanes such as bis(p-toluenesulfonyl)diazomethane, methylsulfonyl-p-toluenesulfonyl)diazomethane, 1-cyclohexylsulfonyl-1-(1,1-dimethylethylsulfonyl) diazomethane, bis(1,1-dimethylethylsulfonyl)diazomethane, bis(1-methylethylsulfonyl) diazomethane, bis (cyclohexylsulfonyl)diazomethane, bis(2,4-dimethylphenylsulfonyl)diazomethane, bis-(4-ethylphenylsulfonyl)diazomethane, bis(3-methylphenylsulfonyl)diazomethane, bis(4-methoxyphenylsulfonyl)-diazomethane, bis(4-fluorophenylsulfonyl)diazomethane, bis-(4-chlorophenylsulfonyl)diazomethane and bis(4-tert-butylphenylsulfonyl)diazomethane; (b) sulfonylcarbonyl alkanes such as 2-methyl-2-(p-toluenesulfonyl) propiophenone, 2-(cyclohexyl-carbonyl)-2-p-toluenesulfonyl)propane, 2-methanesulfonyl-2-methyl-(4-methylthio)propiophenone and 2,4-dimethyl-2-(p-toluenesulfonyl)pentane-3-one; (c) sulfonylcarbonyldiazomethanes such as 1-p-toluenesulfonyl-1-cyclohexylcarbonyldiazomethane, 1-diazo-1-methylsulfonyl-4-phenyl-2-butanone, 1-cyclohexyl-sulfonyl-1-cyclohexylcarbonyldiazomethane, 1-diazo-1-cyclohexylsulfonyl-3,3-di-methyl-2-butanone, 1-diazo-1-(1,1-dimethylethyl sulfonyl)-3,3-dimethyl-2-butanone, 1-acetyl-1-(1-methylethylsulfonyl) diazomethane, 1-diazo-1-(p-toluenesulfonyl)-3,3-dimethyl-2-butanone, 1-diazo-1-benzenesulfonyl-3,3-di-methyl-2-butanone, 1-diazo-1-(p-toluenesulfonyl)-3-methyl-2-butanone, 2-diazo-2-(p-toluenesulfonyl)cyclohexylacetate, 2-diazo-2-benzene sulfonyl tert-butyl acetate, 2-diazo-2-methanesulfonyl isopropyl acetate, 2-diazo-2-benzenesulfonyl cyclohexyl acetate, and 2-diazo-2-(p-toluenesulfonyl)tert-butyl acetate; (d) nitrobenzyl derivatives such as 2-nitrobenzyl-p-toluenesulfonate, 2,6-dinitrobenzyl-p-toluenesulfonate, and 2,4-dinitrobenzyl-p-trifluoro-methylbenzenesulfonate; and (e) esters of polyhydroxy compounds and aliphatic or aromatic sulfonic acids such as pyrogallic methane sulfonate ester (pyrogallol trimesylate), pyrogallic benzene sulfonate ester, pyrogallic p-toluene sulfonate ester, pyrogallic p-methoxy benzene sulfonate ester, pyrogallic mesitylene sulfonate ester, pyrogallic benzylsulfonate ester, alkyl gallic acid methane sulfonate ester, alkyl gallic acid benzene sulfonate ester, alkyl gallic acid p-toluene sulfonate ester, alkyl gallic acid p-methoxy benzene sulfonate ester, alkyl gallic acid mesitylene sulfonate ester, and alkyl gallic acid benzylsulfonate ester. Preferred are the alkyl group in the afore-mentioned alkyl gallic acid where the alkyl group has from 1 to 15 carbon atoms, and especially octyl group or lauryl group, (f) onium salt-based acid-generating agents to be in a general formula (2) and (3), and (g) benzoin tosylate-based acid-generating agents to be in a general formula (4) may be used. A general formula (2):

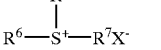

$$R^4—I^+—R^5X^- \quad (2)$$

where $R^4$ and $R^5$ are aryl groups or aryl groups having a substituent and may be respectively identical or different; $X^-$ is any of $AsF_6$, $SbF_6$, $PF_6$, $BF_4$, or $CF_3SO_3$.

and a general formula (3):

$$R^6—S^+(R^8)—R^7X^- \quad (3)$$

where $R^6$, $R^7$, and $R^8$ are aryl groups or aryl groups having a substituent and may be respectively identical or different; $X^-$ is any of $AsF_6$, $SbF_6$, $PF_6$ $BF_4$, or $CF_3SO_3$.

A general formula (4):

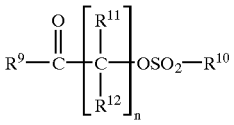

$$R^9—C(=O)—[C(R^{11})(R^{12})]_n—OSO_2—R^{10} \quad (4)$$

where $R^9$ and $R^{10}$ are aryl groups or aryl groups having a substituent and may be identical or different; $R^{11}$ and $R^{12}$ are hydrogen atoms, lower alkyl groups, hydroxyl groups, or aryl groups and may be identical or different. n is 0 or 1.

The following are offered as specific onium salts from 5 to 26 presented by general formulas (2) and (3).

(5)

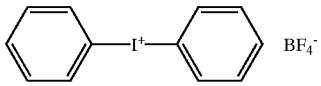

diphenyliodonium tetrafluoroborate (6)

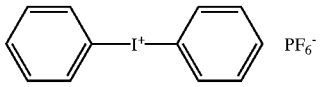

diphenyliodonium hexafluorophosphate (7)

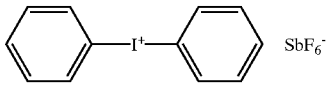

diphenyliodonium hexafluoroantimonate (8)

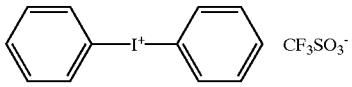

diphenyliodonium trifluoromethane sulfonate (9)

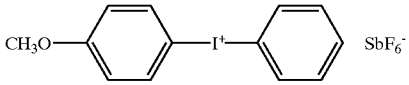

(4-methoxyphenyl)phenyliodonium hexafluoroantimonate

-continued (10)

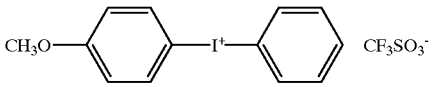

(4-methoxyphenyl)phenyliodonium trifluoromethane sulfonate (11)

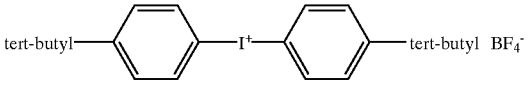

bis(p-tert-butylphenyl)iodonium tetrafluoroborate (12)

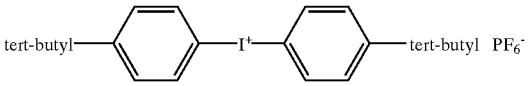

bis(p-tert-butylphenyl)iodonium hexafluorophosphate (13)

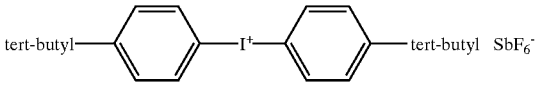

bis(p-tert-butylphenyl)iodonium hexafluoroantimonate (14)

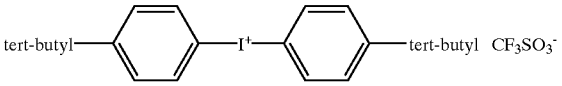

bis(p-tert-butylphenyl)iodonium trifluoromethane sulfonate (15)

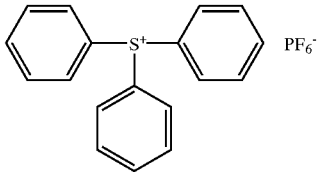

triphenylsulfonium hexafluorophosphate (16)

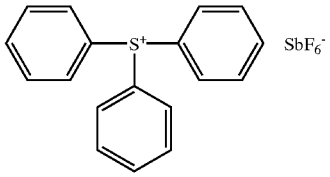

triphenylsulfonium hexafluoroantimonate (17)

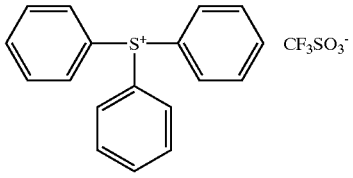

triphenylsulfonium trifluoromethane sulfonate (18)

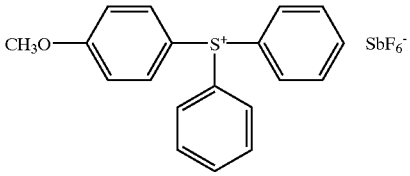

(4-methoxyphenyl)diphenylsulfonium hexafluoroantimonate

-continued (19)

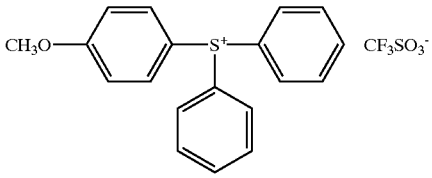

(4-methoxyphenyl)diphenylsulfonium trifluoromethane sulfonate (20)

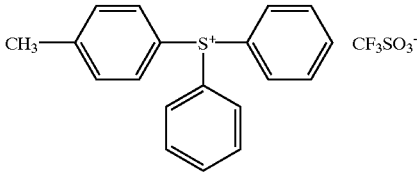

(4-methylphenyl)diphenylsulfonium trifluoromethane sulfonate (21)

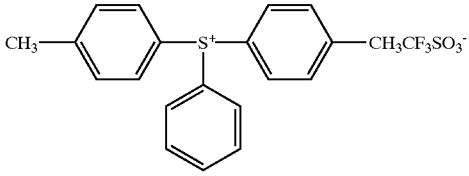

bis(4-methylphenyl)phenylsulfonium trifluoromethane sulfonate (22)

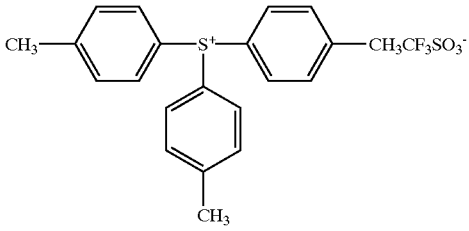

tris(4-methylphenyl)sulfonium trifluoromethane sulfonate (23)

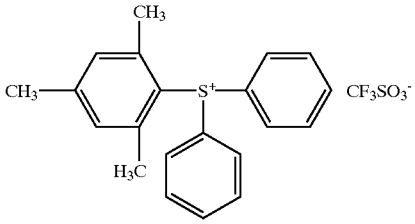

(2,4,6-trimethylphenyl)diphenylsulfonium trifluoromethane sulfonate (24)

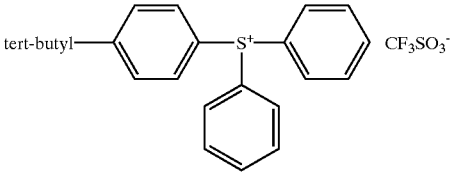

(4-tert-butyl-phenyl)diphenylsulfonium trifluoromethane sulfonate

-continued (25)

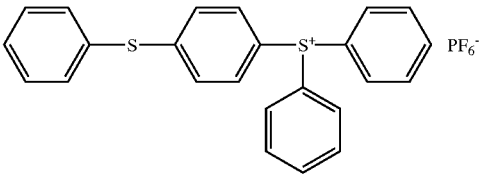

diphenyl[4-(phenylthio)phenyl]sulfonium hexafluorophosphate (26)

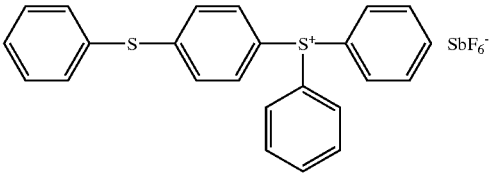

diphenyl[4-(phenylthio)phenyl]sulfonium hexafluoroantimonate

Among these onium salts, onium salts where trifluoromethanesulfonate forms a negative ion are favorable in that they do not contain phosphorous, boron, antimony, or other atoms used as dispersing agents during semiconductor element manufacturing.

The following compounds are offered as specific benzoin tosylate-based acid-forming agents from 27 to 31.

(27)

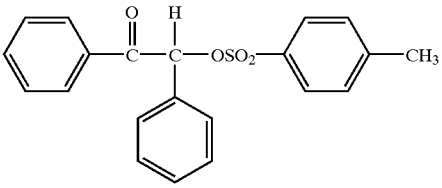

(28)

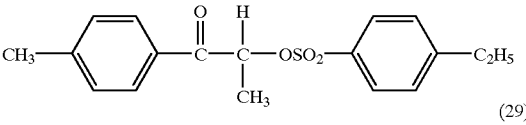

(29)

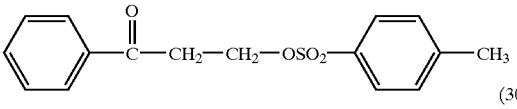

(30)

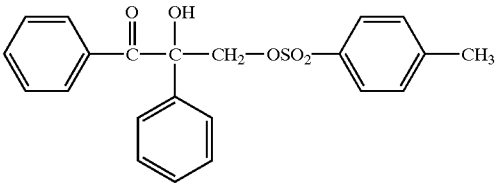

(31)

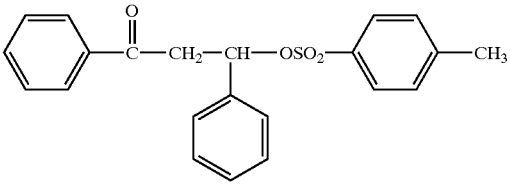

One of these acid-forming agents may be used, or two or more may be used in combination. Among these, as the acid-generating agents to be in the resists for excimer laser beams, preferred are bissulfonyl diazomethanes, especially bis(cyclohexylsulfonyl)diazomethane, bis(2,4-dimethylphenylsulfonyl)diazomethane, esters of polyhydroxy compounds and aliphatic or aromatic sulfonic acids of (e), especially pyrogallol trimesylate and their mixture. Particularly, the mixture is preferred since the composition containing the mixture has high sensitivity.

As the acid-generating agents to be in the resists for electron beams, preferred are nitrobenzyl derivatives of (d), particularly 2,6-dinitrobenzyl-p-toluenesulfonate; esters of polyhydroxy compound and aliphatic or aromatic sulfonic acids of (e), particularly pyrogallol trimesylate; onium salts of (f), particularly bis(p-tert-butylphenyl)iodonium trifluoromethanesulfonate, triphenylsulfonium trifluoromethanesulfonate; and (g) benzoin tosylate type acid-generating agents.

The proportion of the above-mentioned acid-generating agent to be in the composition of the present invention may be from 1 to 20 parts by weight, preferably from 2 to 10 parts by weight, relative to 100 parts by weight of the resin component in the composition. If the proportion of the acid-generating agent is less than 1 part by weight, the agent insufficiently exhibits its effect. If, however, it is more than 20 parts by weight, such too much amount of the agent cannot be completely dissolved in a solvent and, in addition, the miscibility of the agent with the resin component is lowered.

The positive resist composition of the present invention contains an organic carboxylic acid compound in addition to the above mentioned components. With the addition of the organic carboxylic acid compound, a sensitivity, a resolution, good width characteristic in focus depth are improved and moreover, resist patterns with good profiles are obtainable on various kinds of substrates with good post-exposure storage stability.

The organic carboxylic acid compound to be in the composition of the present invention is not specifically defined but may be any of saturated or unsaturated aliphatic carboxylic acids, alicyclic carboxylic acids, hydroxycarboxylic acids, alkoxy-carboxylic acids, keto-carboxylic acids, aromatic carboxylic acids, etc. For example, the acid compound includes aliphatic mono- or polycarboxylic acids such as formic acid, acetic acid, propionic acid, butyric acid, isobutyric acid, oxalic acid, malonic acid, succinic acid, glutaric acid, and adipic acid; alicyclic carboxylic acids such as 1,1-cyclo-hexanedicarboxylic acid, 1,2-cyclohexanedicarboxylic acid, 1,3-cyclohexanedicarboxylic acid, 1-4-cyclohexanedicarboxylic acid, and 1,1-cyclohexyldiacetic acid; unsaturated aliphatic carboxylic acids such as acrylic acid, crotonic acid, isocrotonic acid, 3-butenoic acid, methacrylic acid, 4-pentenoic acid, propiolic acid, 2-butynoic acid, maleic acid, fumaric acid, and acetylenecarboxylic acid; hydroxycarboxylic acids such as hydroxyacetic acid; alkoxy-carboxylic acids such as methoxyacetic acid and ethoxyacetic acid; keto-carboxylic acids such as pyruvic acid; and aromatic carboxylic acid compounds described by a general formula (32)

(32)

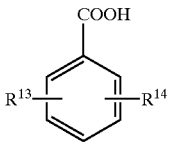

wherein $R^{13}$ and $R^{14}$ each independently represent a hydrogen atom, a hydroxyl group, a nitro group, a carboxyl group or a vinyl group, provided that both $R^{13}$ and $R^{14}$ should not be hydrogen atoms.

or those of a general formula (33):

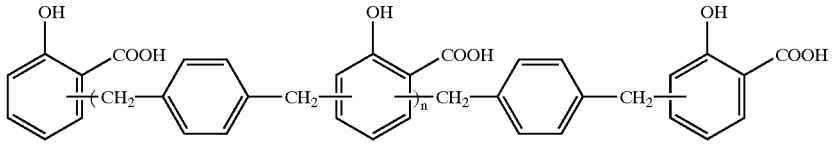

(33)

wherein n represents 0 or an integer of from 1 to 10, etc.

Of these, especially preferred are alicycliccarboxylic acid compounds, unsaturated aliphatic carboxylic acid compounds and aromatic carboxylic acid compounds.

As examples of the aromatic carboxylic acid compounds of formula (32), mentioned are p-hydroxybenzoic acid, o-hydroxybenzoic acid, 2-hydroxy-3-nitrobenzoic acid, 3,5-dinitrobenzoic acid, 2-nitrobenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, 2-vinylbenzoic acid, 4-vinylbenzoic acid, phthalic acid, terephthalic acid, and iso-phthalic acid, etc. Especially preferred are benzoic acids having an o-positioned substituent, such as o-hydroxybenzoic acid, 2-nitrobenzoic acid and phthalic acid, etc.

The aromatic carboxylic acid compounds of formula (33) can be used either as a single compound where n is a singular number or as a combination of two or more different compounds. In practical use, the composition of the present invention preferably contains, as the acid compound. SAX (trade name, produced by Mitsui Toatsu Chemical Co.) which is sold as a phenolic compound.

One or more of the above-mentioned aromatic carboxylic acid compounds of formula (32) and (33) above can be in the composition of the present invention. The composition of the present invention containing any of these aromatic carboxylic acid compounds gives resist patterns with good profiles. In addition, the composition has good post-exposure storage stability and therefore always gives resist patterns with good profiles without depending on the period of time needed after the exposure of the composition and before the heating treatment thereof. In particular, the aromatic carboxylic acid compounds of formula (32) are preferred, since the composition of the present invention containing any of them gives resist patterns with true rectangular profiles.

The proportion of the above-mentioned organic carboxylic acid compound to be in the composition of the present invention may be from 0.01 to 1% by weight, preferably from 0.05 to 0.5% by weight, more preferably from 0.07 to 0.3% by weight, relative to the sum of the resin component and the acid-generating agent to be in the composition. If the proportion of the organic carboxylic acid compound is less than 0.01% by weight, the composition cannot give resist patterns with good profiles. If, however, it is more than 1% by weight, the loss of the resulting film in the unexposed regions is increased.

The positive resist composition of the present invention may contain (D) amines, in addition to the above mentioned components of (A) to (C), in the range of from 0.01 to 1% by weight, preferably from 0.05 to 0.5% by weight relative to the component (A) so as to prevent excessive diffusion of an acid generated when exposed to radiation and to form a good resist pattern faithful to the mask pattern used and furthermore, to improve the resolution and post-exposure storage stability of the composition containing them. As the component of (D) the follwing compounds include aliphatic amines, aromatic amines, and heterocyclic amines. As the aliphatic amines, concretely are offered dimethylamine, trimethylamine, ethylamine, diethylamine, triethylamine, n-propylamine, di-n-propylamine, tri-n-propylamine, isopropylamine. As the aromatic amines, concretely are offered benzyl amine, aniline, N-methylaniline, N,N-dimethylaniline, o-methylaniline, m-methylaniline, p-methylaniline, N,N-diethyl aniline, diphenylamine, di-p-tolylamine. As the heterocyclic amines, concretely are offered pyridine, o-methylpyridine, o-ethylpyridine, 2,3-dimethylpyridine, 4-ethyl-2-methylpyridine, 3-ethyl-4-methylpyridine. Among these amines, aliphatic amines, particularly tertiary amine of strong base and having low boiling points such as trimethylamine, triethylamine are preferable and can be used singly or a mixture of two or more in combination.

The positive resist composition of the present invention may contain (E) N,N-dialkylcarboxylic acid amides, in addition to the above mentioned components of (A) to (C) or (A) to (D). Isolated resist pattern can be improved in form by including said component of (E). The proportion of the component of (E) is preferably ranged between 0.1 and 5% by weight relative to the component of (A). As the component of (E), lower carboxylic acid amides having N,N-dialkyl substituent are preferably used, and concretely are offered N,N-dimethyl formamide or N,N-dimethyl acetamide. Said component of (E) can be used singly or a mixture of two or more in combination.

The positive resist composition of the present invention may preferably contains, in addition to the above-mentioned components, a light-absorbing agent. As examples of the light-absorbing agent, mentioned are benzophenone or esters of polyphenols with naphthoquinone-1,2-diazide-5-(or -4-) sulfonic acid such as 1-[1-(4-hydroxyphenyl) isopropyl]-4-[1,1 -bis(4-hydroxyphenyl)-ethyl]benzene, bis (4-hydroxy-3,5-dimethylphenyl)-3,4-dihydroxyphenyl methane. The light-absorbing agent can be preferably used since its ability to improve the sensitivity and the resolution of the composition containing it is excellent and since it additionally has the ability to inhibit the influence of standing waves on the resist composition thereby making the composition not into resist patterns with waved profiles but into resist patterns with true rectangular profiles. The proportion of the light-absorbing agent to be in the composition of the present invention may be not more than 30% by weight, preferably from 0.5 to 15% by weight, relative to the sum of the components (A) and (B). If the proportion of the agent is more than 30% by weight, the profiles of the resist patterns to be given by the composition containing it are unfavorably worsened.

It is desirable that the positive resist composition of the present invention is used as a solution comprising the above-mentioned components dissolved in a solvent. As examples of the solvent, mentioned are ketones such as acetone, methyl ethyl ketone, cyclohexanone, methyl isoamyl ketone and 2-heptanone; polyhydric alcohols or derivatives thereof such as ethylene glycol, ethylene glycol monoacetate, diethylene glycol, diethylene glycol monoacetate, propylene glycol, propylene glycol monoacetate, dipropylene glycol, and dipropylene glycol monoacetate as well as ethers thereof, for example monomethyl ethers, monoethyl ethers, monopropyl ethers, monobutyl ethers and monophenyl ethers; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxy propionate, etc. These solvents can be used singly or as a mixture of two or more of them.

The positive resist composition of the present invention may contain, if desired, conventional miscible additives, such as additional resins to improve the properties of the resist films, as well as a plasticizer, a stabilizer, a colorant, a surfactant, etc.

The positive resist composition of the present invention is dissolved in a solvent, and the resulting solution is coated on a semiconductor silicon wafer, a substrate coated with an insulating film such as silicon nitride (SiN), BPSG or the like film or on a substrate coated with a metallic film such as titanium nitride (TiN), Al-Si-Cu, tungsten or the like film, using a spinner or the like, dried to form a photosensitive layer on said substrate, exposed to deep-UV rays, excimer laser beams via a desired mask pattern or subjected to imaging with electron beams, using a minifying projection exposure machine or the like, followed by heating treatment and then developed with a developer such as a weakly-alkaline aqueous solution containing from 1 to 10% by weight of tetramethylammonium hydroxide or the like. After this process, a good resist pattern faithful to the mask pattern used is formed on the substrate, not depending on the kind of the substrate used.

Next, the present invention is described in more detail by means of the following production examples and working examples, which, however, are not intended to restrict the scope of the present invention.

PRODUCTION EXAMPLE 1

120 g of polyhydroxystyrene having a weight-average molecular weight of 13,000 and a molecular weight distribution ($M_w/M_n$) of 1.5 were dissolved in 680 g of N,N-dimethyl acetamide, and 85.0 g of di-tert-butyl dicarbonate were added to the resulting solution and stirred to completely dissolve them. Next, 59 g of triethylamine were dropwise added thereto over a period of about 15 minute. After the addition, this mixture was further stirred for about 3 hours. Next, to the resulting solution added was pure water of 20 times the solution. This was further stirred to make polyhydroxystyrene where the hydroxyl groups had been partly substituted by tert-butoxycarbonyloxy groups precipitated therein. The thus-precipitated product was washed with pure water, dewatered and dried to obtain 150 g of polyhydroxystyrene (a weight-average molecular weight of 13,000 and a molecular weight distribution ($M_w/M_n$) of 1.5) where 39 mol % of the hydroxyl groups had been substituted by tert-butoxycarbonyloxy groups.

PRODUCTION EXAMPLE 2

120 g of polyhydroxystyrene having a weight-average molecular weight of 13,000 and a molecular weight distribution ($M_w/M_n$) of 1.5 were dissolved in 680 g of N,N-dimethyl acetamide, and 42.3 g of 1-chloro-1-ethoxyethane were added to the resulting solution and stirred to completely dissolve them. Next, 78.8 g of triethylamine were dropwise added thereto over a period of about 30 minute. After the addition, this mixture was further stirred for about 3 hours. Next, to the resulting solution added was pure water of 20 times the solution. This was further stirred to make polyhydroxystyrene where the hydroxyl groups had been partly substituted by 1-ethoxyethoxy groups precipitated therein. The thus-precipitated product was washed with pure water, dewatered and dried to obtain 130 g of polyhydroxystyrene (a weight-average molecular weight of 13,000 and a molecular weight distribution ($M_w/M_n$) of 1.5) where 39 mol % of the hydroxyl groups had been substituted by 1-ethoxyethoxy groups.

COMPARATIVE PRODUCTION EXAMPLE 1

150 g of polyhydroxystyrene having a weight-average molecular weight of 13,000 and a molecular weight distribution ($M_w/M_n$) of 4.0 where 39 mol % of the hydroxyl groups had been substituted by tert-butoxycarbonyloxy groups was produced in the same manner as in Production Example 1, except that the polyhydroxystyrene was changed to the polyhydroxystyrene having a weight-average molecular weight of 13,000 and a molecular weight distribution ($M_w/M_n$) of 4.0.

COMPARATIVE PRODUCTION EXAMPLE 2

150 g of polyhydroxystyrene having a weight-average molecular weight of 13,000 and a molecular weight distribution ($M_w/M_n$) of 4.0 where 39 mol % of the hydroxyl groups had been substituted by 1-ethoxyethoxy groups was produced in the same manner as in Production Example 2, except that the polyhydroxystyrene was changed to the polyhydroxystyrene having a weight-average molecular weight of 13,000 and a molecular weight distribution ($M_w/M_n$) of 4.0.

EXAMPLE 1

3 g of polyhydroxystyrene obtained in Production Example 1, in which 39 mol % of the hydroxyl groups had been substituted by tert-butoxycarbonyloxy groups, and 7 g of polyhydroxystyrene obtained in Production Example 2, in which 39 mol % of the hydroxyl groups had been substituted by ethoxyethoxy groups, 0.4 g of bis(cyclohexyl-sulfonyl) diazomethane, 0.1 g of bis(2,4-dimethylphenylsulfonyl) diazomethane, 0.2 g of pylogallol-trimesylate, 0.02 g of salicylic acid and 0.1 g of benzophenone were dissolved in 45 g of propylene glycol monomethyl ether acetate, and 0.03 g of triethylamine and 0.5 g of N,N-dimethylacetamide were dissolved in the resulting solution. The solution was filtered through a 0.2 $\mu$m membrane filter to obtain a coating liquid of positive resist.

The thus-prepared coating liquid was coated on a silicon wafer, using a spinner, and dried on a hot plate at 80° C. for 90 seconds to form a resist film having a thickness of 0.7 $\mu$m on the wafer. This was exposed to radiation at various levels of dose which dose was varied by 1 mJ/cm$^2$, using a minifying projection exposure machine, NSR-2005EX8A (produced by Nicon Co.), heated at 105° C. for 90 seconds, then developed it in an aqueous solution of 2.38% by weight of tetramethylammonium hydroxide at 23° C. for 65 seconds, washed with water for 30 seconds, and dried to form a resist pattern on the wafer. The resist pattern thus formed was a 0.21 $\mu$m line-and-space pattern. The crosssectional profile of the resist pattern was good and almost rectangular without being influenced by standing waves. The minimum exposure amount, at which the resist coated was patterned into a large-area resist pattern detectable with the naked eye while the surface of the substrate was exposed to be seen, was measured to be 11 mJ/cm$^2$.

The heat resistance of said large-area resist pattern formed from the resist was measured to be at 135° C. (The heat resistance as referred to herein means the temperature at which the pattern formed begins to flow under heat.) The width of focus depth was evaluated based on a criteria that the maximum width ($\mu$m) of a focus by which a 0.25 $\mu$m line-and-space pattern was formed by 1:1 was 2.0 $\mu$m. When the resist solution was stored in a brown bottle at 25° C. for evaluation of storage stability, no generation of solid substances had been observed for six months.

Furthermore, using this resist, a resist pattern was formed in the same manner as above. The post-exposure storage stability, which is defined as an elapsed time from exposure to heat treatment for forming a 0.25 $\mu$m line-and-space pattern having good, rectangular crosssectional profile, was measured to be 90 minutes.

COMPARATIVE EXAMPLE 1

3 g of polyhydroxystyrene obtained in Comparative Production Example 1, and 7 g of polyhydroxystyrene obtained in Comparative Production Example 2, 0.7 g of bis (cyclohexylsulfonyl)diazomethane, and 0.05 g of salicylic acid were dissolved in 45 g of propylene glycol monomethyl ether acetate, and 0.01 g of triethylamine and 0.2 g of N,N-dimethylacetamide were dissolved in the resulting solution. The solution was filtered through a 0.2 $\mu$m membrane filter to obtain a coating liquid of positive resist.

Using the thus-prepared coating liquid, a resist pattern was formed in the same manner as in Example 1. The resist pattern thus formed was a 0.21 $\mu$m line-and-space pattern. The crosssectional profile of the resist pattern was good and almost rectangular without being influenced by standing waves. The minimum exposure amount, at which the resist coated was patterned into a large-area resist pattern detectable with the naked eye while the surface of the substrate was exposed to be seen, was measured to be 15 mJ/cm$^2$.

The heat resistance of said large-area resist pattern formed from the resist was measured to be at 125° C.(The heat resistance as referred to herein mean the temperature at which the pattern formed begins to flow under heat.) The width of focus depth was evaluated based on a criteria that the maximum width ($\mu$m) of a focus by which a 0.25 $\mu$m line-and-space pattern was formed by 1:1 was 1.6 $\mu$m. When the resist solution was stored in a brown bottle at 25° C. for evaluation of storage stability, no generation of solid substances had been observed for six months.

Furthermore, using this resist, a resist pattern was formed in the same manner as in Example 1 except that the resist was, after exposed, heated at 110 for 90 seconds. The post-exposure storage stability, which is defined as an elapsed time from exposure to heat treatment for forming a 0.25 $\mu$m line-and-space pattern having good, rectangular crosssectional profile, was measured to be 60 minutes.

EXAMPLE 2

A coating liquid of resist was formed in the same manner as in Example 1, except that a silicon wafer coated with a metallic film of TiN was used as the substrate. The resist pattern thus formed was a 0.23 $\mu$m line-and-space pattern. The crosssectional profile of the resist pattern was good and almost rectangular, without being influenced by standing waves.

EXAMPLE 3

A resist pattern was formed in the same manner as in Example 1, except that a silicon wafer coated with an insulating film of BPSG was used as the substrate. The resist pattern thus formed was a 0.23 $\mu$m line-and-space pattern. The crosssectional profile of the resist pattern was good and almost rectangular, without being influenced by standing waves.

What is claimed is:

1. A positive resist composition comprising a mixture of (A) a resin component whose solubility in an alkaline aqueous solution is increased by the action of acids, (B) a chemical compound which generates an acid when exposed to radiations, (C) an organic carboxylic acid compound and (D) an amine, in which said resin component (A) is a mixture comprising (a) polyhydroxystyrene having a weight-average molecular weight of from 8,000 to 25,000 and a molecular weight distribution ($M_w/M_n$) of 1.5 or less where from 10 to 60 mol % of the hydroxyl groups have been substituted by residues of a general formula (I):

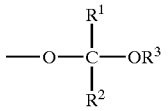

wherein $R^1$ represents a hydrogen atom or a methyl group, $R^2$ represents a methyl group or an ethyl group, and $R^3$ represents a lower alkyl group having 1 to 4 carbon atoms;

and (b) a polyhydroxystyrene having a weight-average molecular weight of from 8,000 to 25,000 and a molecular weight distribution ($M_w/M_n$) of 1.5 or less where from 10 to 60 mol % of the hydroxyl groups have been substituted by tert-butoxy-carbonyloxy groups.

2. The positive resist composition as claimed in claim 1, in which said component (D) is an aliphatic amine.

3. The positive resist composition as claimed in claim 1, in which the proportion of said component (D) is from 0.01 to 1% by weight relative to the component (A).

4. A positive resist composition comprising a mixture of (A) a resin component whose solubility in an alkaline aqueous solution is increased by the action of acids, (B) a chemical compound which generates an acid when exposed to radiations, (C) an organic carboxylic acid compound and (E) an N,N-dialkylcarbarboxyl acid amide in which said resin component (A) is a mixture comprising (a) a polyhydroxystyrene having a weight-average molecular weight of form 8,000 to 25,000 and a molecular weight distribution ($M_w/M_n$) of 1.5 or less where from 10 to 60 mol % of the hydroxyl groups have been substituted by residues of a general formula (I):

(I)

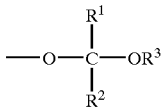

wherein $R^1$ represents a hydrogen atom or a methyl group, $R^2$ represents a methyl group or an ethyl group, and $R^3$ represents a lower alkyl group having 1 to 4 carbon atoms;

and (b) a polyhydroxystyrene having a weight-average molecular weight of from 8,000 to 25,000 and a molecular weight distribution ($M_w/M_n$) of 1.5 or less where from 10 to 60 mol % of the hydroxyl groups have been substituted by tert-butoxycarbonyloxy groups.

5. The positive resist composition as claimed in claim 4, in which said component (E) is dimethylacetamide.

6. The positive resist composition as claimed in claim 4, in which the proportion of said component (E) is from 0.1 to 5% by weight relative to the component (A).

7. The positive resist composition as claimed in claim 1, which further contains (E) an N,N-dialkylcarbarboxyl acid amide in addition to components (A), (B), (C) and (D).

8. The positive resist composition as claimed in claim 7, in which said component (D) is an aliphatic amine and said component (E) is dimethylacetamide.

9. The positive resist composition as claimed in claim 7, in which the proportion of said component (D) is from 0.01 to 1% by weight and that of said component (E) is from 0.01 to 5% by weight relative to the component (A).

*10. A substituted polyhydroxystyrene resin comprising (a) polyhydroxystyrene having a weight-average molecular weight of from 8,000 to 25,000 and a molecular weight distribution ($M_w/M_n$) of 1.5 or less where from 10 to 60 mol % of the hydroxyl groups have been substituted by residues of a general formula (I):*

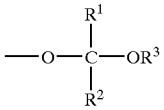

(I)

*wherein $R^1$ represents a hydrogen atom or a methyl group, $R^2$ represents a methyl group or an ethyl group, and $R^3$ represents a lower alkyl group having 1 to 4 carbon atoms.*

*11. The substituted polyhydroxystyrene resin as claimed in claim 10 wherein the hydroxyl groups are substituted by 1-ethoxy-ethoxy groups or 1-methoxy-n-propoxy groups.*

*12. A mixture of substituted polyhydroxystyrene resins comprising a mixture of the substituted polyhydroxystyrene (a) of claim 10 and (b) a polyhydroxystyrene having a weight-average molecular weight of from 8,000 to 25,000 and a molecular weight distribution ($M_w/M_n$) of 1.5 or less where from 10 to 60 mol % of the hydroxyl groups have been substituted by tert-butoxy-carbonyloxy groups.*

*13. The mixture of substituted polyhydroxystyrene resins (a) and (b) as claimed in claim 12 in which the mixing proportion of the resin (a) to resin (b) is in the range from 30:70 to 90:10 by weight.*

*14. The mixture of substituted polyhydroxystyrene resins (a) and (b) as claimed in claim 13 in which the mixing proportion of the resin (a) to resin (b) is in the range from 50:50 to 80:20 by weight.*

* * * * *

UNITED STATES PATENT AND TRADEMARK OFFICE

CERTIFICATE OF CORRECTION

PATENT NO. : RE 38,254 E
DATED : September 16, 2003
INVENTOR(S) : Kazufumi Sato et al.

It is certified that error appears in the above-identified patent and that said Letters Patent is hereby corrected as shown below:

Column 16,
Line 46, “form” should read -- from --.

Signed and Sealed this

Fifteenth Day of June, 2004

JON W. DUDAS
*Acting Director of the United States Patent and Trademark Office*